US 6,681,781 B2

United States Patent
Puri et al.

(10) Patent No.: US 6,681,781 B2
(45) Date of Patent: *Jan. 27, 2004

(54) METHODS FOR CLEANING MICROELECTRONIC SUBSTRATES USING ULTRADILUTE CLEANING LIQUIDS

(75) Inventors: Suraj Puri, Los Altos, CA (US); Joseph Medeiros, Jr., Santa Clara, CA (US); David Scott Becker, Excelsior, MN (US); Natraj Narayanswami, Eden Prairie, MN (US)

(73) Assignee: FSI International, Inc., Chaska, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/411,820

(22) Filed: Oct. 1, 1999

(65) Prior Publication Data

US 2002/0011253 A1 Jan. 31, 2002

Related U.S. Application Data

(63) Continuation-in-part of application No. 09/311,800, filed on May 13, 1999.

(51) Int. Cl.$^7$ ................................................. B08B 3/04
(52) U.S. Cl. ................... 134/1.3; 134/1; 134/2; 134/21; 134/25.4; 134/32; 134/36; 134/42; 134/902
(58) Field of Search .................. 134/1, 1.3, 2, 21, 134/25.4, 32, 36, 42, 902

(56) References Cited

U.S. PATENT DOCUMENTS

| 4,125,427 A | * 11/1978 | Chen et al. ................. 252/79.3 |
| 5,262,201 A | * 11/1993 | Chandra et al. .......... 427/376.2 |
| 5,464,480 A | 11/1995 | Matthews ................... 134/1.3 |

(List continued on next page.)

FOREIGN PATENT DOCUMENTS

| EP | 0 718 873 | 6/1996 |
| EP | 0 731 498 | 9/1996 |
| EP | 0 844 650 | 5/1998 |
| JP | 11008214 | 1/1999 |

OTHER PUBLICATIONS

Resnick et al. "A study of Cleaning Performance and Mechanisms in Dilute SC–1 Processing". Ultraclean Semiconductor Processing Technology & Surface Chemical Cleaning and Passivation, pp. 21–26, vol. 386, 1995.*

Kern, W. Handbook of Semiconductor Wafer Cleaning Technology, pp. 49–52, 1993.*

Resnick et al., "A Design of Experiments Approach to An Optimized SC–1/Megasonic Clean for Sub–0.15 Micron Particle Removal," *Proceedings of the third Int. Symp. on Cleaning Technology in Semiconductor Device Manufacturing,* vol. 94–7, pp. 450–457 (1994).

Assignee's co–pending application, U.S. Ser. No. 09/311, 800 filed May 13, 1999.

Assignee's co–pending application, U.S. Ser. No. 09/179, 243 filed Oct. 26, 1999.

(List continued on next page.)

*Primary Examiner*—Sharidan Carrillo
(74) *Attorney, Agent, or Firm*—Kagan Binder, PLLC

(57) ABSTRACT

A method of cleaning a surface of an article using cleaning liquids in combination with acoustic energy. Preferably, an ultradilute concentration of a cleaning enhancement substance, such as ammonia gas, is dissolved in a liquid solvent, such as filtered deionized water, to form a cleaning liquid. The cleaning liquid is caused to contact the surface to be cleaned. Acoustic energy is applied to the liquid during such contact. Optionally, the surface to be cleaned can be oxidized, e.g., by ozonated water, prior to cleaning.

12 Claims, 3 Drawing Sheets

U.S. PATENT DOCUMENTS

| | | | |
|---|---|---|---|
| 5,571,337 A | | 11/1996 | Mohindra et al. ......... 134/25.4 |
| 5,578,273 A | * | 11/1996 | Hanson et al. ............... 422/110 |
| 5,656,097 A | | 8/1997 | Olesen et al. ................... 134/1 |
| 5,722,442 A | * | 3/1998 | Hoffman et al. ......... 134/102.1 |
| 5,776,296 A | | 7/1998 | Matthews ................... 156/345 |
| 5,800,626 A | | 9/1998 | Cohen et al. ................ 134/1.3 |
| 5,853,491 A | * | 12/1998 | Schulz ........................... 134/2 |
| 5,885,362 A | | 3/1999 | Morinaga et al. ............... 134/2 |
| 5,908,509 A | | 6/1999 | Olesen et al. ................ 134/1.3 |
| 5,919,311 A | * | 7/1999 | Shive et al. .................... 134/1 |
| 5,922,442 A | | 7/1999 | Lal et al. ..................... 428/216 |
| 5,950,645 A | * | 9/1999 | Olesen et al. .............. 134/98.1 |
| 5,962,384 A | * | 10/1999 | Cooper et al. ............... 510/175 |
| 5,972,123 A | | 10/1999 | Verhaverbeke ................. 134/3 |
| 5,996,595 A | | 12/1999 | Olesen et al. ................ 134/1.3 |
| 6,132,522 A | * | 10/2000 | Verhaverbeke et al. ....... 134/26 |
| 6,158,445 A | | 12/2000 | Olesen et al. ................ 134/1.3 |
| 6,167,891 B1 | * | 1/2001 | Kudelka et al. ............. 134/1.3 |
| 6,378,534 B1 | | 4/2002 | Olesen et al. ................ 134/1.3 |

OTHER PUBLICATIONS

Resnick, Adkins, Clews, Thomas, and Cannaday, Proceedings of the Third International Symposium, Cleaning Technology in Semiconductor Device Manufacturing, Article "A Design of Experiments Approach to an Optimized SC–1/ Megasonic Clean for Sub–0.15 Micron particle Removal " vol. 94–7, pp. 450–457.

"Particle Removal by Ultra–Dilute Ammonia"—European Semiconductor, vol. 22, No. 3, Mar. 2000.

Miyashita et al. article published by The Electrochemical Society under the title "Optimizing $NH_4OH/H_2O_2$ cleaning process for Ultra–Clean Wafer Surface Preparation," in the *Extended Abstracts*, Abstract No. 463, vol. 91–1, from the Spring Meeting, Washington, D.C., May 5–10, 1991.

Meuris et al. article published by The Electrochemical Society under the title "The Combined Effect of Silicon Surface Roughness and Metal Impurity Contamination on Gate Oxide Integrity," in the *Proceedings of the Second International Symposium on Cleaning Technology in Semiconductor Device Manufacturing*, Proceedings vol. 92–12, pp. 144–161, 1992.

Matthews, Robert C. "In–Situ Gas Generated Aqueous Chemicals and Their Impact on Chemical Purity," published by Balazs Analytical Laboratory in the Chemical Proceedings titled "Semiconductor Pure Water and Chemicals Conference, Feb. 11–13, 1992, Santa Clara, California" at pp. 3–15.

Puri et al. paper (including abstract) presented on Oct. 19, 1999 at the ECS Fall 1999 meeting.

Puri et al. article published by the Electrochemical Society under the title "An Ultradilute Ammonia Process for Particle Removal," in the ECS Proceedings of the Sixth International Symposium, vol. 99–36, titled "Cleaning Technology in Semiconductor Device Manufacturing," at pp. 180–187.

Puri et al. article published by Angel Publishing under the title "Particle Removal by Ultra–dilute Ammonia," in Mar. of 2000 in the European Semiconductor Journal at pp. 35–36 and 38–39.

van den Meerakker et al., "A Mechanistic Study of Silicon Etching in $NH_3/H_2O_2$ Cleaning Solutions," J. Electrochem. Soc., vol. 137, No. 4, Apr. 1990.

* cited by examiner

METHODS FOR CLEANING MICROELECTRONIC SUBSTRATES USING ULTRADILUTE CLEANING LIQUIDS

This application is a continuation-in-part application of U.S. patent application Ser. No. 09/311,800 filed May 13, 1999 in the names of Puri et al. , which application is incorporated herein by reference in its entirety.

FIELD OF THE INVENTION

The present invention relates to methods of cleaning the surfaces of articles, particularly microelectronic devices at one or more points during the manufacture of such devices. More particularly, the present invention relates to methods of cleaning surfaces of microelectronic devices using wet processing techniques in conjunction with the application of acoustic energy and/or in conjunction with an oxidizing pre-treatment. In preferred embodiments, cleaning liquids of the present invention are ultradilute solutions formed by dissolving a gas solute in a suitable solvent.

BACKGROUND OF THE INVENTION

Since the early days of the microelectronic industry, the importance of minimizing contamination on microelectronic devices throughout the manufacturing process has been recognized. Contaminants include particles, photoresist residue, and/or the like whose presence can adversely impact the performance and function of microelectronic devices if not adequately removed. Accordingly, various cleaning treatments have been devised.

However, as the end product devices have become more and more miniaturized, a contaminant occupies an increased percentage of the available space for circuitry and other device elements. Hence, cleanliness of the materials has become far more critical, and cleanliness specifications have become increasingly more stringent. Unfortunately, these trends make cleaning much more challenging.

One traditional cleaning approach has involved the use of an aqueous solution of $H_2O_2$ and $NH_4OH$ to carry out cleaning in which the volume ratio of the peroxide to aqueous ammonia to water typically is 1:1:5. These relatively concentrated mixtures are commonly referred to as the Standard Cleaning Solution 1 ("SC-1"). The SC-1 process is believed to detach particles through surface etching. The use of megasonic energy in combination with the SC-1 chemistry is reported to improve particle detachment.

In basic solution, many common particle types will bear the same kind of surface charge as do silicon and silicon dioxide surfaces being cleaned, theoretically causing the particles and the surfaces to repel each other via electrostatic repulsion. However, SC-1 cleaning solutions tend to have very high ionic strength, causing the electrostatic repulsion forces to be negligible as a practical matter. Electrostatic repulsion forces therefore play only a minor role, if any, in connection with the SC-1 chemistry.

Although widely used, the SC-1 approach has drawbacks. These relatively concentrated solutions might clean effectively, but unfortunately they can also deposit metal contaminants onto the devices being cleaned. Of course, a cleaning method that deposits contaminants is counterproductive. These concentrated solutions can also unduly etch and damage the surfaces of the devices being cleaned. Device damage is also a result that is desirably avoided by a cleaning method. As still another drawback, the peroxide typically must incorporate stabilizers, and these can contaminate the surface being cleaned, which also is counterproductive especially when relatively high concentrations of peroxide are used.

Another cleaning approach is described in U.S. Pat. No. 5,656,097. This approach involves cleaning devices with aqueous solutions of ammonia and hydrogen peroxide in combination with the application of megasonic energy. In this approach, the dilute solutions are prepared by diluting more concentrated solutions of aqueous ammonia with water. The approach has drawbacks. Although dilute, these solutions can still unduly etch the devices being cleaned, metal contaminants can still be deposited, and the stabilizer for the peroxide is still a contaminant. Further, it is very difficult to prepare dilute solutions with good accuracy by diluting relatively small volumes of concentrated solutions with relatively large volumes of solvent. The inaccuracy can lead to differences in cleaning performance from device to device.

It can be seen, therefore, that improved cleaning methods that can satisfy these more stringent demands imposed by miniaturization are still needed.

SUMMARY OF THE INVENTION

The present invention provides an approach for cleaning articles, such as microelectronic devices at various stages of manufacture, that is extremely effective at removing particle contaminants and/or organic debris, e.g., photoresist remnants, from the device surfaces. In preferred embodiments, the approach accomplishes cleaning without depositing metal contaminants onto the surface of the devices and without undue etching or other damage of the surfaces. As used herein, the term "microelectronic device" includes but is not limited to semiconductor wafers, integrated circuits, thin film heads, flat panel displays, microelectronic masks, and the like. The term shall also refer to partially completed devices as they are being manufactured.

The approach of the present invention is significant in at least two respects. First, preferred embodiments of the present invention achieve cleaning efficiencies of better than 99.9% with respect to particles having a size greater than about 0.16 microns. Second, in addition to high particle removal efficiency, it is also important to carry out cleaning operations without adversely affecting surface smoothness and without depositing additional contaminants, e.g., metal contaminants, onto the surface being cleaned. Preferred embodiments of the present invention do not adversely affect surface roughness in any significant way. In fact, preferred cleaning embodiments of the present invention have actually provided post-clean surfaces that are smoother than the same pre-cleaned surfaces Metal contamination of preferred embodiments is neutral, meaning that cleaning operations deposit substantially no, if any, metal contaminants onto the surfaces being treated.

Preferred embodiments of the invention carry out cleaning operations using the combination of acoustic energy and a cleaning liquid comprising an ultradilute concentration of a cleaning enhancement agent. Amazingly, the combined use of acoustic energy, particularly megasonic energy, and ultradilute cleaning reagents provides exceptional cleaning performance even though the amount of cleaning enhancement agent in the reagent is almost negligible as a practical matter. For example, reagents containing approximately 100 ppm gaseous anhydrous ammonia dissolved in filtered deionized water remove particles from substrates such as semiconductor wafers with very high efficiency.

In one aspect, the present invention provides a method of cleaning a surface of an article using ultradilute cleaning liquids in combination with acoustic energy. An ultradilute concentration of a cleaning enhancement substance, such as ammonia gas, is dissolved in a liquid solvent, such as filtered deionized water, to form a cleaning liquid. The cleaning liquid optionally may also include other ingredients, such as hydrogen peroxide, if desired, but such additives are not needed and may not even be desired to achieve excellent cleaning performance. The cleaning liquid is caused to contact the surface to be cleaned. Contact can occur by causing the liquid to flow past the surface, by spraying the liquid onto the surface, by submerging the surface in a body of the liquid, and/or the like. Preferably, acoustic energy is applied to the liquid during such contact.

In another aspect, the present invention provides a cleaning method in which a surface of an item to be cleaned is first contacted with a processing liquid comprising an oxidizing agent. A preferred processing liquid for this purpose is ozonated water, but solvents such as water containing other oxidants such as hydrogen peroxide could also be used if desired. Next, the surface is contacted with a cleaning liquid, preferably ultradilute aqueous ammonia. Acoustic energy is directed into the cleaning liquid during at least a portion of the time that contact with the cleaning liquid is occurring.

In another aspect, the present invention provides a cleaning method in which a substrate is positioned in a cleaning vessel with the surface to be cleaned being substantially vertical. A cleaning liquid comprising and ultradilute concentration of a cleaning enhancement substance, preferably ammonia, is then introduced into the vessel. As the vessel fills, the rising top surface of the cleaning liquid traverses the substrate surface. Acoustic energy is applied to the rising cleaning liquid.

In still another aspect, the present invention involves a method of cleaning a surface of an article in which an ultradilute concentration of a gaseous cleaning enhancement substance is dissolved in a liquid solvent to form a cleaning liquid. The cleaning liquid is caused to contact the substrate surface. While causing the cleaning liquid to contact the substrate surface, acoustic energy is applied to the cleaning liquid. After causing the cleaning liquid to contact the substrate surface, the substrate surface is rinsed and then dried. Preferably, drying occurs by contacting the substrate surface with a first process reagent comprising a carrier gas, preferably nitrogen, and a cleaning enhancement substance, preferably an ultradilute concentration of isopropyl alcohol. The substrate surface is also contacted with a drying reagent comprising a heated gas, preferably heated nitrogen.

DETAILED DESCRIPTION

Figure 1:
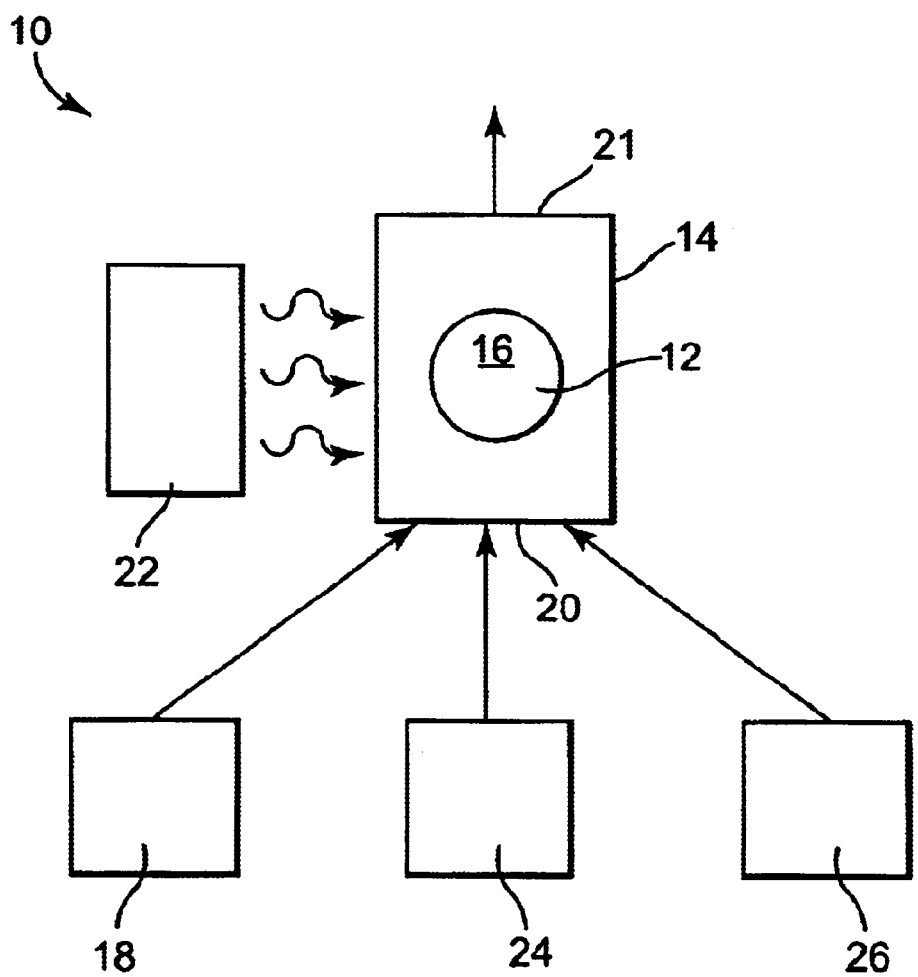
FIG. 1 is a schematic flow chart of a preferred system for practicing the principles of the present invention.

For purposes of illustration, the principles and methods of the present invention will now be described in connection with system 10 shown in FIG. 1. One or more substrates, such as semiconductor wafer 12, are positioned inside cleaning vessel 14. In a preferred orientation when processing liquids are introduced into cleaning vessel 14 from the bottom (as is shown), wafer 12 is positioned so that the surface 16 of wafer 12 to be cleaned is oriented substantially vertically during cleaning operations. Substantially vertically means that the surface is tilted at an angle in the range from 0 degrees to about 10 degrees. For planar substrates such as semiconductor wafer 12, a slight tilt away from vertical is desired in order to help prevent adjacent substrates from being jostled against each other, or against any carrier (not shown) in which the wafers are held, as processing fluid flows past the substrates. Such tilting is optional and may not be desirable in some processes. For example, 200 mm wafers need not be tilted at an angle due to their mass, but 150 mm wafers can advantageously be tilted at an angle of 7 degrees to 8 degrees. This principle of supporting planar substrates at a slight tilt away from vertical is described further in U.S. Pat. No. 5,571,337.

A flow of cleaning liquid from cleaning liquid source 18 is introduced into cleaning vessel 14 through inlet end 20 and is discharged through outlet end 21. Cleaning vessel 14 preferably is made of material that is as transmissive as practically possible to acoustic energy so that acoustic energy from acoustic energy source 22 (described further below) is applied to the contents of cleaning vessel 14 with minimal energy loss due to reflection or absorption of the energy by the walls of cleaning vessel 14. The material used to form cleaning vessel 14 should also shatter resistant and strong enough so that the material resists cracking, chipping, or shattering during use. Examples of such materials include PTFE available under the trade designations Teflon or Hylar), quartz, combinations of these, and the like. Of these, quartz is preferred. When processing liquids are introduced into cleaning vessel 14 through inlet structure (not shown in FIG. 1) such as a sparger, manifold, other flow distribution device, or the like, such inlet structure, to the extent that it is in the path of acoustic energy directed into cleaning vessel 14 also is made of an acoustic energy compatible material such as quartz.

Cleaning vessel 14 can be any kind of cleaning vessel that allows a flow of cleaning fluid to be maintained past wafer 12. For example, cleaning vessel 14 can be the cascade, overflow vessel incorporated into the Series 6000 equipment commercially available from Yield Up International, Inc., Mountain View, Calif.

As the cleaning liquid flows through cleaning vessel 14, the liquid contacts and helps to clean, e.g., remove particles and/or other impurities, from surface 16 of wafer 12. The cleaning liquids of the present invention generally include a solvent and cleaningly effective amounts of one or more cleaning enhancement substances. Examples of solvents that can be used in the practice of the present invention include deionized water as well as isopropyl alcohol, ethanol, methanol, other polar organic solvents. Of these, deionized water is most preferred. Examples of cleaning enhancement substances include $NH_3$, $NH_4OH$, HCl, HF, ozone, and the like. Generally, acid cleaning enhancement substances are suitable for cleaning metal surfaces, whereas basic cleaning enhancement substances such as ammonia are suitable for cleaning nonmetallic surfaces such as silicon and silicon oxide surfaces. For cleaning liquids comprising ultradilute concentrations of a cleaning enhancement substance in a solvent (described further below), it is preferred that the cleaning enhancement substance be a gaseous solute dissolved in the solvent. When the solute is supplied as gas to be dissolved into the solvent, the cleaning liquid can be formed by mixing appropriate flows of the solvent and the gas. This allows the ultradilute concentration of the solute in the solvent to be controlled with great accuracy. Gases can also be filtered to a degree not possible with liquids, meaning that the gas solute can be provided with a high level of purity.

In the practice of the present invention, any deionized water incorporated into any processing liquid that is caused to contact wafer 12 preferably is electrostatically filtered using the Clean Point® filtration unit commercially available from Yield Up International, Mountain View, Calif. This particular filtration unit uses a series of positive and negatively charged filters and is extremely effective at removing extremely particles from process water with only a minimal pressure drop through the filtration unit. The features and operation of such filters are further described in U.S. Pat. No. 5,571,337.

The concentration of the cleaning enhancement substance in the cleaning liquid will depend upon how the principles of the present invention are being practiced. For instance, in embodiments of the present invention in which cleaning operations comprise an oxidizing pretreatment (described below), the concentration of the cleaning enhancement substance in the cleaning liquid can vary within a wide effective range. Preferably such concentration is ultradilute. The term "ultradilute" preferably means that the volume ratio of the solvent to the cleaning enhancement agent is in the range from 500:1 to 500,000:1, preferably 1000:1 to 300,000:1, more preferably 100,000:1 to 200,000:1. In some instances in which it may not be practical to determine a volume ratio, then these ratios may be determined on a molar basis.

Surprisingly, it has now been discovered that ultradilute solutions of cleaning enhancement substances are extremely effective and beneficial cleaning liquids for use in the manufacture of microelectronic devices. The fact that ultradilute solutions have any cleaning effect at all is unexpected, yet such cleaning compositions offer numerous advantages. First, ultradilute solutions cause insignificant, if any, etching of the surface being cleaned. For example, studies have shown that only a few angstroms, if even that much, of the native oxide surface is etched when cleaning occurs with an ultradilute cleaning liquid. Thus, a surface cleaned with an ultradilute cleaning liquid is less affected than if it were to be cleaned with more concentrated solutions that can etch tens, if not hundreds, of angstroms of the surface during a cleaning operation.

Second, ultradilute solutions effectively clean an extremely high percentage of particles from surfaces of microelectronic devices, which is a result that is counter to conventional wisdom in the manufacture of microelectronic devices. Conventional wisdom has suggested that the active cleaning agent in a cleaning liquid must be present at high enough concentrations in order to undergo primarily a bulk reaction, e.g., etching, with the substrate surface. The belief has been that a surface must be measurably etched in order to remove particles from the surface. However, bulk reactions are not always desirable since such reactions can damage, e.g., unduly roughen, the substrate in ways that are difficult to control. Surprisingly, ultradilute cleaning liquids accomplish removal of particles from substrate surfaces with substantially no etching of the substrate surface. As used herein, substantially no etching means that 10 angstroms or less, more preferably 5 angstroms or less, of the surface is etched by the cleaning liquid. In some instances, we have even observed no measurable etching of the substrate surface after cleaning.

While not wishing to be bound by theory, a possible rationale to explain the unexpected cleaning capabilities offered by ultradilute cleaning liquids can be suggested. It is believed that the ultradilute concentration of a cleaning enhancement substance alters the pH of the cleaning liquid enough so that the zeta potential characteristics of particle contaminants on the substrate surface and/or of the substrate surface itself are altered when the surface is being cleaned with a flow of these solutions. Specifically, it is believed that the zeta potential alteration causes the substrate surface and the particles to be characterized by opposite surface charges so that electrostatic repulsion between the particle contaminates and the surface helps to eject the particles away from the surface where the particles are more easily caught up and carried away by the flowing cleaning liquid. Being ultradilute, the solutions have relatively low ionic strength, and the electrostatic repulsion forces can play a key role in particle removal. Thus, ultradilute cleaning liquids are believed to benefit from interfacial reactions occurring at the liquid-solid interface between the cleaning liquid, on the one hand, and the substrate surface and particles, on the other hand. This is a completely different cleaning mechanism than the bulk reactions more characteristic of more concentrated cleaning liquids.

Still yet another advantage of using ultradilute solutions is that cleaning occurs rapidly. For example, five minutes, more preferably three minutes, is adequate for cleaning the substrate surface 16. This short cleaning duration means fast cycle times. Yet, on the other hand, if it were to be desired for some reason to carry out cleaning for a longer duration, that could be done without damaging substrate surface 16 since the cleaning liquid has very little effect upon the substrate surface due to the ultradilute concentration of the cleaning enhancement substance.

As another advantage, it is believed that ultradilute solutions deposit insignificant amounts, if any, of metal contaminants onto the surfaces being cleaned.

Cleaning liquids may, if desired, be prepared by diluting a concentrated liquid solution of the cleaning enhancement substance with the desired solvent. However, when the cleaning liquid contains only an ultradilute concentration of the cleaning enhancement substance, it can be very difficult to accurately control such dilution when the dilution occurs continuously over a period of time (as opposed to batchwise dilution) to support a steady state cleaning operation. As a consequence, unfortunately, the concentration of the cleaning enhancement substance in the diluted cleaning liquid can vary quite a bit. This variation in concentration may adversely affect the performance of the cleaning operations. In contrast to the dilution approach, it is substantially easier to establish and maintain a uniform ultradilute concentration of the cleaning enhancement substance in the solvent when the cleaning enhancement substance is supplied as a gas. Appropriate flow rates of the solvent and the gaseous cleaning enhancement substance are easily established and mixed together to form a cleaning liquid with the desired ultradilute concentration. A number of gas/liquid mixing devices are known for accomplishing this. A preferred gas/liquid mixer is commercially available under the trade designation from Legacy Systems, Inc.

In addition to cleaning liquid source 18, one or more other sources of processing fluids, such as a gas, liquid, slurry, and/or the like, may optionally also be fluidly coupled to cleaning vessel 14 so that such other processing fluids may also be used to treat surface 16 of wafer 12 before, during, or after cleaning operations. For purposes of illustration, FIG. 1 shows system 10 as including two additional sources 24 and 26 of processing fluids.

In preferred embodiments, optional fluid source 24 is a source of a rinsing fluid that is present so that surface 16 optionally can be rinsed before and/or after being treated with the cleaning liquid and/or any other processing liquid. A preferred rinsing fluid is deionized water that has been electrostatically filtered using the Clean Point R filtration unit.

Optional fluid source 26 is preferably an oxidizing processing liquid comprising a suitable solvent and an amount of an oxidizing agent effective to oxidize the surface of the wafer 12 without unduly affecting its physical (e.g., surface smoothness characteristics) and functional characteristics (e.g., electronic characteristics of operational structures formed on or in the wafer 12, if any). Such an oxidizing fluid may be used to oxidize surface 16 of wafer 12 before treatment of surface 16 with the cleaning liquid from cleaning liquid source 18. Advantageously, such an oxidizing pre-treatment enhances the effectiveness of the cleaning operation for at least three reasons. First, the oxidizing pre-treatment and subsequent treatment with the cleaning liquid work together to more effectively clean substrate surface 16, because the oxidizing pre-treatment it oxidizes organic materials on the surface, such as photoresist remnants, which may then be easier to remove. The oxidizing treatment thus boosts cleaning performance because it extends the cleaning effect to a class of materials, organic materials, that otherwise might not be effectively removed by the subsequent treatment with the cleaning liquid. Oxidizing treatment is thus desirable when surface 16 is known to have organic contaminants such as photoresist remnants.

Second, the oxidizing treatment also forms an oxide barrier layer on the surface of substrate 12 that protects the substrate from being damaged by the cleaning liquid when such protection may be desired. Such damage is more of a concern when the cleaning liquid might be an etchant of the substrate surface being cleaned. For example, silicon can react with aqueous ammonia solutions. In contrast, silicon oxide tends to be less reactive with such aqueous ammonia solutions. Accordingly, when the cleaning liquid is aqueous ammonia and the substrate surface 16 includes silicon, it can be desirable to oxidize the silicon surface of the substrate to form a protective oxide barrier over the silicon before contacting the substrate surface 16 with the aqueous ammonia.

Third, the resultant oxide surface tends to enhance the cleaning effect when the surface comprises silicon being oxidized to silicon oxide. In particular, it has been observed that cleaning a silicon surface with ultradilute aqueous ammonia is more effective in conjunction with an oxidized surface. Although the reason for this is not known, it is believed that the electrostatic repulsion forces between substrate surface 16 and particle contaminants are stronger when surface 16 is oxidized.

Preferred oxidizing compositions are aqueous solutions containing deionized water as a solvent and an oxidizing agent selected from ozone, hydrogen peroxide, nitric acid, combinations of these, and the like. Preferably, the oxidizing composition is ozonated water containing an ultradilute concentration of ozone. More preferably, the oxidizing agent is ozonated water containing 5 ppm to 100 ppm, preferably 10 ppm to 50 ppm, most preferably about 17 ppm ozone. Use of ultradilute ozonated water is advantageous because such compositions cause the formation of a thin, protective oxide layer without otherwise affecting the wafer 12 in any significant way. Ozonated water also is very easy to purify. In contrast, oxidizing agents such as hydrogen peroxide are much more difficult to purify and also contain stabilizers which are themselves contaminants. Oxidants such as nitric acid are less desirable than ozone in that aqueous nitric acid is also a strong etchant and therefore may also tend to etch the substrate too much.

System 10 also includes source 22 of acoustic energy operationally coupled to cleaning vessel 14 so that acoustic energy can be directed into cleaning vessel 14. Examples of acoustic energy include sonic, supersonic, ultrasonic, and megasonic energy. The use of megasonic energy is preferred in that megasonic energy is most effective at removing smaller particles from substrate surface 16. Equipment for generating acoustic energy is commercially available from a number of vendors. Particularly preferred equipment for applying megasonic energy to cleaning vessel 14 includes a generator model no. 68101 and a series 98S or series 7857S transducer, or the like, commercially available from Kaijo Corp. Advantageously, use of this particular equipment allows acoustic source 22 and cleaning vessel 14 to be made of easily separable structures so that either unit can be removed for service, replacement, or repair as needed. This significantly lowers the cost of maintaining system 10 in that one of the cleaning vessel and acoustic source 22 can be serviced without touching the other. In contrast, many previously known designs integrate the acoustic source and cleaning vessel so that independent service, replacement, and repair are not practical. Such an interdependent design is more expensive to maintain since replacement of one part would necessitate replacement of both parts.

In one particularly preferred embodiment of the present invention, the cleaning liquid is most preferably an ultradilute, aqueous ammonia solution formed by dissolving anhydrous ammonia gas in filtered, deionized water. It has been found that this cleaning liquid provides extremely effective cleaning performance, particularly when the surface to be cleaned comprises silicon oxide. In another particularly preferred embodiment of the present invention suitable for cleaning silicon surfaces, the surfaces are first oxidizing by treatment with ozonated water and then treated with a cleaning liquid in the form of an ultradilute, aqueous ammonia solution formed by dissolving anhydrous ammonia gas in filtered, deionized water. It has been found that this combination provides an extremely high level of cleaning performance, particularly when the substrate surface to be cleaned is hydrophobic before treatment and/or includes organic contaminants.

In a preferred mode of operation, an optional flow of rinsing liquid from source 24 is established through cleaning vessel 14. Substrates 12 may be positioned in cleaning vessel either before or after this flow is established. The substrates in the case of wafers, masks, disks, flat panels, liquid crystal displays, thin film heads, photomasks, lenses, and the like, can be face to face, back to back, face to back, or back to face. Face to face and back to back is a preferred orientation. This flow may occur at room temperature for 2 to 5 minutes using flow rates appropriate to the type of equipment being used in accordance with instructions provided by the vendor. For example, in a cascade rinse vessel of the type incorporated into the equipment sold by Yield Up International, Inc., the flow rate in this and all other processing steps of the preferred mode of operation may be in the range from 0.1 to 50, preferably 0.5 to 10, more preferably about 5 gallons per minute.

Optionally, a flow of oxidizing liquid from source 26 may replace the flow of rinsing liquid through cleaning vessel 14 in order to oxidize substrate surface 16. This flow may be established with or without dumping the rinse liquid first. Preferably, however, the flow of oxidizing liquid is established without dumping the rinse liquid when the oxidizing liquid flow is established. The length of time and temperature for carrying out this treatment will depend upon factors including the composition of the oxidizing liquid, the nature of substrate surface 16, and the like. For ozonated water containing about 5 to 100, preferably 10 to 60, more preferably about 17 ppm ozone, treating wafer 12 for 2 to 5 minutes at room temperature would be suitable. These conditions allow an oxide layer to form on substrate surface having a thickness in the range of 8 angstroms to 11 angstroms. Shorter processing times may be used, but the formation of oxide may be incomplete. Longer times may offer no additional benefit, thus increasing cycle time and expense without good reason.

Next, wafer 12 is again optionally rinsed with the rinsing liquid, preferably filtered deionized water, in order to wash away the oxidizing liquid. This rinsing step may occur under the same range of processing conditions that are suitable for the first rinsing step noted above, except that the rinsing liquid preferably is heated for this rinse. If heated, the temperature of the rinsing liquid preferably may be any temperature in the range from about ambient temperature to 85° C. The ozonated water of the previous step may be optionally dumped prior to introducing the rinsing liquid.

Next, a flow of the cleaning liquid through cleaning vessel 14 is established. This can be done with or without dumping the rinsing liquid first. However, in embodiments in which the cleaning liquid is ultradilute with respect to the cleaning enhancement substance, it is preferred to dump the rinsing liquid first before establishing a cascading flow of the cleaning liquid. Dumping may take more time, but cleaning performance is dramatically better. While the reason for this is not known, a possible rationale can be suggested. When the rinse liquid is dumped, cleaning vessel 14 is empty, at least in the sense that no part of wafer 12 is submerged in processing liquid when cleaning liquid is introduced into cleaning vessel 14. Accordingly, in a cascading rinse cleaning vessel, the top surface of cleaning liquid rises and traverses across surface 16 as cleaning vessel 14 fills. It is believed that the zeta potential effects are quite strong at the moving interface between the liquid surface and the substrate surface 16, facilitating particle removal.

Treatment with the cleaning liquid may be carried out at any convenient temperature within a wide range. For example, the cleaning liquid can be chilled to any temperature below ambient, but above which the cleaning liquid freezes, at ambient temperature, or heated to a temperature above ambient but below which the cleaning liquid would boil. For example, for aqueous cleaning liquids comprising ultradilute concentrations of ammonia (i.e., ultradilute, aqueous ammonium hydroxide), the cleaning liquid preferably can be supplied at any temperature or temperatures in the range from 0° C. to 98° C., preferably 20° C. to about 85° C. The cleaning liquid and cleaning vessel can be pressurized if it is desired to expand the temperature range within which the cleaning liquid could be supplied in the liquid phase.

Excellent cleaning results are obtained by heating the cleaning liquid to elevated temperatures in the range from about 60° C. to about 85° C., which are typical temperatures used in connection with the SC-1 chemistry. However, unlike SC-1 chemistry, excellent cleaning performance can be achieved with ultradilute cleaning liquids of the present invention at unconventionally low cleaning temperatures. For example, the performance of SC-1 chemistry generally is poor at low temperatures below about 60° C., particularly below about 30° C. because the etching rate of the cleaning liquid slows down too much at such lower temperatures. In contrast, the cleaning performance of ultradilute cleaning liquids of the present invention is maintained, and is even improved in key aspects, as the temperature of the liquid is reduced. Accordingly, preferred embodiments of the invention involve supplying the cleaning liquid at a temperature below about 30° C., preferably from about 0° C. to about 25° C.

During the cleaning step, acoustic energy, preferably megasonic energy, is directed into the cleaning liquid. A suitable acoustic range is about 3 watts/cm$^2$ or less.

Following treatment with the cleaning liquid, the cleaned wafer 12 can be processed further in any desired way, depending upon what stage of manufacture the wafer is at. In some instances, the substrate may be subjected to additional manufacturing steps. In other instances, the wafer may be simply rinsed and dried. Preferred rinsing and drying is accomplished by removing the wafer 12 from the cleaning vessel and transferring the substrate 12 to a second treatment vessel in which an STG™ rinse/dry treatment is carried out. The equipment for performing such a treatment, is described in U.S. Pat. No. 5,571,337. Additionally, preferred equipment for carrying out an STG™ rinse/dry is commercially available from Yield Up International, Inc.

As an overview, the STG™ process involves first rinsing the items to be rinsed and dried with a cascading flow of filtered deionized water. This rinse occurs in a vessel having a cascade overflow design with a blanket of low flow, hot nitrogen. The level of deionized water is then slowly dropped. A typical drop rate is on the order of 0.5 mm/s to 15 mm/s, preferably 1 mm/s to 2 mm/s. As the liquid level is dropped, the low flow, hot nitrogen is maintained, but a flow of nitrogen containing an ultradilute concentration of a cleaning enhancement substance, such as isopropyl alcohol, is also introduced. When the water level drops below the items being rinsed and dried, the liquid contents of the vessel are quickly dumped, e.g., at a rate of 20 mm/s. This quick dump occurs while the flows of the hot nitrogen and the nitrogen/IPA mix are maintained. After the quick dump of the liquid contents, the flow of nitrogen/IPA is stopped while the flow of the hot nitrogen is increased to a higher rate to dry the items, e.g., 300 liters/min to 600 liters/min. The resulant dried items can then be removed for further use, processing, storage, or the like. For this process, the nitrogen and nitrogen/IPA are preferably filtered. The hot nitrogen is heated to about to 130° C. but is believed to be at a temperature of about 50° C. in the rinse/dry vessel when it enters the rinse/dry vessel through nozzles in the lid of the rinse/dry vessel.

Figure 2:
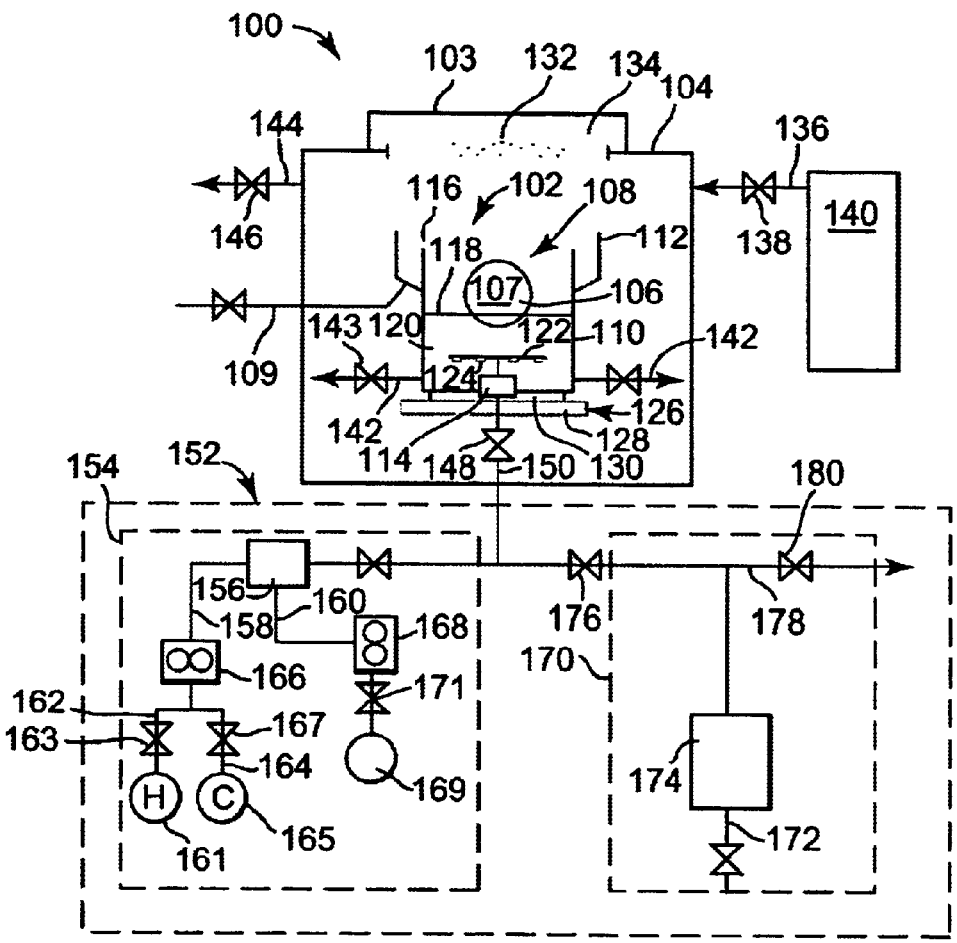
FIG. 2 is a schematic diagram of a single tank system of the present invention suitable for pretreating devices with ozonated water and then following up by cleaning the devices with ultradilute, aqueous ammonia.

In order to more concretely illustrate the principles of the present invention, FIG. 2 is a schematic illustration of a preferred system 100 suitable for cleaning one or more substrates 106 using cascading flows of deionized water, ozonated water, and/or ultradilute, aqueous ammonia as processing liquids. The principles of system 100 may be carried out in actual practice using a Model 6200 or other Series 6000 apparatus commercially available form Yield Up International, Mountain View, Calif.

System 100 generally includes cleaning vessel 102 contained inside housing 104. Housing 104 may include one or more access panels such as lid 103 in order to allow access to the interior of housing 104 for purposes of loading and unloading substrates, maintaining system 100, conducting repairs, and the like.

Cleaning vessel 102 is suitable for establishing a cascade flow of one or more process liquids past one or more substrates 106 positioned inside cleaning chamber 108. Cleaning vessel 102 is formed from inner tank 110 defining cleaning chamber 108 and outer tank 112. At least inner tank 110, and preferably outer tank 112 as well, are preferably made of a material such as quartz that absorbs as little acoustic energy as possible. Conventionally, substrates 106 are supported inside cleaning chamber 108 on a suitable carrier (not shown). In the case of semiconductor wafers, one representative wafer carrier is described in U.S. Pat. No. 5,571,337. Processing liquid enters cleaning chamber through inlet 114 positioned at the bottom of inner tank 110. The outlet of cleaning chamber 108 is formed by rim 116. A cascading flow of processing liquid introduced into cleaning chamber 108 through inlet 114 thus flows upward and cascades over rim 116 into outer tank 112 from which the processing liquid can be recycled or discarded as desired through valved drain line 109.

The cascading flow of processing liquid can be established past substrates 106 either before or after substrates 106 are positioned inside cleaning chamber 108. If substrates 106 are placed into cleaning chamber 108 before the cascading flow is established, then, as is shown, top surface 118 of processing liquid 120 will rise until processing liquid 120 fills inner tank 110 and then cascades over rim 116 into outer tank 112. As inner tank 110 fills and top surface 118 of processing liquid 120 rises, top surface 118 traverses upward and across surface 107. This kind of traversal is particularly desirable when processing liquid 120 is ultradilute aqueous ammonia in that cleaning performance is much better when this traversal occurs. As noted above, the reason for this is not known with certainty, but it is believed that electrostatic repulsion between surface 107 and particles on surface 107 are strongest at the interface between surface 107 and top surface 118 of processing liquid 120. Thus, as top surface 118 of processing liquid 120 moves up surface 107 of substrate 106, electrostatic repulsion is believed to help knock particles off the surface and 120 into the body of processing liquid 120 where the particles are more easily carried away.

Processing liquid from chemical supply line 150 is introduced into inner tank 110 through sparger 122 positioned at the bottom of inner tank 110. Sparger 122 is a conduit comprising a plurality of bottom orifices 124 through which processing liquid 120 is discharged into inner tank 110. By discharging processing liquid 120 downward into inner tank 110, currents and eddies against substrates 106 are minimized and laminar flow through inner tank 110 is more easily achieved. Sparger 122 is preferably made of a material such as quartz that absorbs as little acoustic energy as possible. Cleaning vessel 102 is positioned over megasonic energy source 126 containing megasonic device 128 and fluid coupling 130 through which megasonic energy is applied to the contents of inner tank 110. The commercially available megasonic energy system listed above and commercially available from Kaijo Corp. because such a system allows cleaning vessel 102 to be removably coupled to system 100 so that cleaning vessel 102 independently can be easily removed for maintenance, repair, or replacement.

Optionally, although not required, it may be desirable to maintain a blanket 132 of clean, inert gas over the top of cleaning vessel 102 to minimize the exposure of substrates 106 to particles and other contaminants in the ambient. When such a blanket 132 of inert gas is desired, inert gas such as $N_2$ or the like can be introduced into volume 134 above cleaning vessel 102 through gas supply line 136. The flow rate of inert gas through gas supply line 136 is controlled by valve 138. Although not shown in FIG. 2, the inert gas preferably is filtered to ensure that the inert gas supplied to volume 134 is clean. The inert gas can be supplied from any suitable source, but is preferably supplied from reservoir 140. Reservoir 140 contains a reserve of inert gas that can quickly fill housing 104 when processing liquid is dumped from cleaning vessel 102 through drain line(s) 142. The inert gas an be exhausted from housing 104 through gas exhaust line 144. Flow of inert gas through gas exhaust line 144 can be controlled by valve 146.

Valve 148 on chemical supply line 150 can be adjusted to control the flow of processing liquid introduced into inner tank 110 through sparger 122. The bottom of inner tank 110 is also fitted with one or more drain valves 143 on one or more drain lines 142 so that the contents of inner tank 110 can be quickly dumped to shorten cycle time.

One or more processing liquids are supplied to chemical supply line 150 from chemical supply 152. As shown, chemical supply 152 preferably provides the capability of delivering processing liquids comprising deionized water, ozonated water, and/or ultradilute aqueous ammonia to chemical supply line 150. With respect to supplying ultradilute aqueous ammonia, chemical supply 152 includes aqueous ammonia supply 154 that provides the capability of forming aqueous ammonia on demand from filtered deionized water and filtered ammonia gas in mixer 156. Water is supplied to mixer 156 through water supply line 158, and ammonia gas from source 169 is supplied to mixer 156 through ammonia supply line 160. Valve 171 controls the flow of ammonia gas from source 169. Hot water from source 161 is provided via hot water supply line 162, and the flow of hot water may be controlled with valve 163. Cold water from source 165 is provided via cold water supply line 164, and the flow of cold water may be controlled by valve 167. The cold and hot water can be supplied to mixer 156 separately. Alternatively, appropriate ratios of the two water flows can be combined when it is desired to supply water to mixer 156 that has a temperature intermediate between the temperatures of the hot and cold water streams.

The water supplied to mixer 156 is preferably cleaned using filter device 166. Although any filter device could be used, the Clean Point filtration system commercially available from Yield Up International is presently preferred because its combination of positive and negative surface charged filters removes particles from the water, e.g., particles as small as 0.05 microns, with only a minimal pressure drop. The ammonia gas from source 169 is also filtered using an appropriate gas filtration unit 168. Suitable gas filtration units are standard in the industry and are commercially available, for example, from Millipore Corp.

Mixer 156 may be any equipment known in the art that can controllably combine a flow of at least one liquid with a flow of at least one gas. Examples of equipment that could be used to accomplish such gas-in-liquid mixing are widely known and would include bubblers, porous septa, cascade systems, mechanical agitators, and the like. A particularly preferred gas-in-liquid mixer is commercially available from Legacy Systems, Inc., Richardson, Tex. Other gas-in-liquid mixers are also described in U.S. Pat. No. 5,464,480, as well as in Chapter 18 of Perry and Chilton, Chemical Engineer's Handbook, Fifth Edition, 1973.

The use of aqueous ammonia supply 154 as shown offers numerous advantages. First, the use of gaseous ammonia as a solute, instead of a concentrated ammonia solution, allows the user to prepare ultradilute aqueous ammonia solutions with great precision over long periods of time. Very accurate concentrations of ammonia in water can be easily achieved under continuous, steady state conditions merely by controlling the relative flow rates of the water and ammonia gas.

For instance, ammonia concentrations as low as 17 ppm +/−0.05% can be easily established and maintained. This kind of precision cannot be practically achieved by an approach in which water is used to dilute small volumes of more concentrated solutions. Indeed, it is the use of gaseous ammonia as a solute that makes formation of ultradilute solutions repeatable and practically feasible. Second, the processing liquid can be quickly switched from aqueous ammonia to just deionized water simply by turning off the flow of ammonia gas. Thus, aqueous ammonia supply 154 also serves as a supply of deionized water. Third, the temperature of the aqueous ammonia or water, as the case may be, is easily controlled merely by adjusting the relative flow rates of hot and cold water supplied to mixer 156. Fourth, the ultradilute aqueous ammonia not only cleans substrate 106, but it also cleans the surfaces of cleaning vessel 102 and corresponding supply lines and inlet mechanisms that come into contact with the ultradilute aqueous ammonia. Thus, system 100 is also self-cleaning in this regard.

Ozonated water is supplied from ozonated water supply 170. The ozonated water is formed by passing deionized water from valved supply line 172 through ozonator 174 in which ozone is dissolved in the water to form the ozonated supply. Valve 176 controls the flow of ozonated water to cleaning vessel 102. When an ozone generator is first started, it can take a few moments for the ozone generator to reach steady state conditions. It is preferred, therefore, to include bypass 178 so that the ozonating flow can be run continuously even when there is no demand for ozonated water in cleaning vessel 102. Flow through bypass 178 is controlled by valve 180.

According to a preferred mode of operation, a cascading flow of deionized water is established in cleaning vessel 102. The substrates 106 may be positioned in cleaning vessel 102 either before or after the cascading flow is established. The water may be at any convenient temperature ranging from 15° C. to 98° C., but most conveniently is at about room temperature. The flow rate of rinse water can be at any suitable rate. Generally, a flow rate of 0.1 to 100, preferably 1 to 30, more preferably about 5, gallons per minute would be suitable. Rinsing under these conditions for 2 to 5 minutes is generally adequate.

Next, an optional cascading flow of ozonated water past the substrates 106 is established. Treatment with ozonated water is particularly desirable when the surfaces being cleaned are hydrophobic, but can also be beneficial even if the surfaces are hydrophilic. The treatment oxidizes the surfaces, making them hydrophilic. It is believed that cleaning performance is enhanced when the substrate surface is hydrophilic. The flow rate of ozonated water can be at any suitable rate. Generally, a flow rate of 0.1 to 100, preferably 1 to 30, more preferably about 5, gallons per minute would be suitable. Treatment under these flow rates at room temperature for 2 to 5 minutes would be generally adequate with respect to ozonated water containing 5 ppm to 100 ppm, preferably 10 ppm to 50 ppm, most preferably about 17 ppm After the optional ozone treatment, substrates 106 are again rinsed with DI water. In this case, however, the rinse water is preferably heated to a temperature in the range from about ambient to about 85° C. Rinsing with hot water for 2 to 5 minutes at flow rates of 0.1 to 100, preferably 1 to 30, more preferably about 5, gallons per minute would be generally adequate to rinse away any remaining ozone.

After the hot water rinse is complete, a suitable flow rate of semiconductor grade, anhydrous ammonia gas can be turned on in order to dissolve ammonia in the water and form aqueous ammonia. In preferred embodiments, the resultant concentration of dissolved ammonia (which is believed to actually be in the form of $NH_4OH$ in the water) is ultradilute. More preferably, suitable ultradilute aqueous ammonia solutions are prepared by combining 0.001 ml/min to 100 ml/min, more preferably 0.05 to 10 ml/min of ammonia (20 psi and ambient temperature) with 0.1 to 100, preferably 1 to 30, more preferably about 5, gallons per minute deionized water. Optionally, the hot rinse water may be dumped from cleaning vessel 102 before the aqueous ammonia is introduced into cleaning vessel 102, although cleaning performance is better if the hot rinse water is dumped first. Cleaning with the aqueous ammonia at these flow rates and ambient temperature for 2 to 5 minutes would generally be sufficient to accomplish cleaning. After this period of time, the substrates 106 can be pulled out of the cascading flow of aqueous ammonia for further treatment as desired, or the aqueous ammonia can be dumped from cleaning vessel 102 before transferring the substrates 106 to another treatment and/or subjecting the substrates 106 to further treatment in the same cleaning vessel 102.

FIG. 2 shows system 100 which includes only a single processing vessel in which the ammonia treatment, and optionally the ozone treatment, are carried out. However, in preferred embodiments, such cleaning treatments are carried out in conjunction with other treatments that may occur in the same vessel, in the same apparatus, but a different vessel, or in a different apparatus. For example, the Model 6200 system commercially available from Yield Up International includes both a megasonic cleaning vessel for carrying out ammonia cleaning treatments as described above as well as a separate processing vessel for carrying out STG™ rinsing and drying as described in U.S. Pat. No. 5,571,337. Both the ammonia cleaning vessel and the STG™ rinse/dry vessel of the Model 6200 system are contained in the same housing to allow both the cleaning and the rinsing/drying to occur in the same controlled environment, thus avoiding transport from one piece of equipment to another between treatments.

Figure 3:
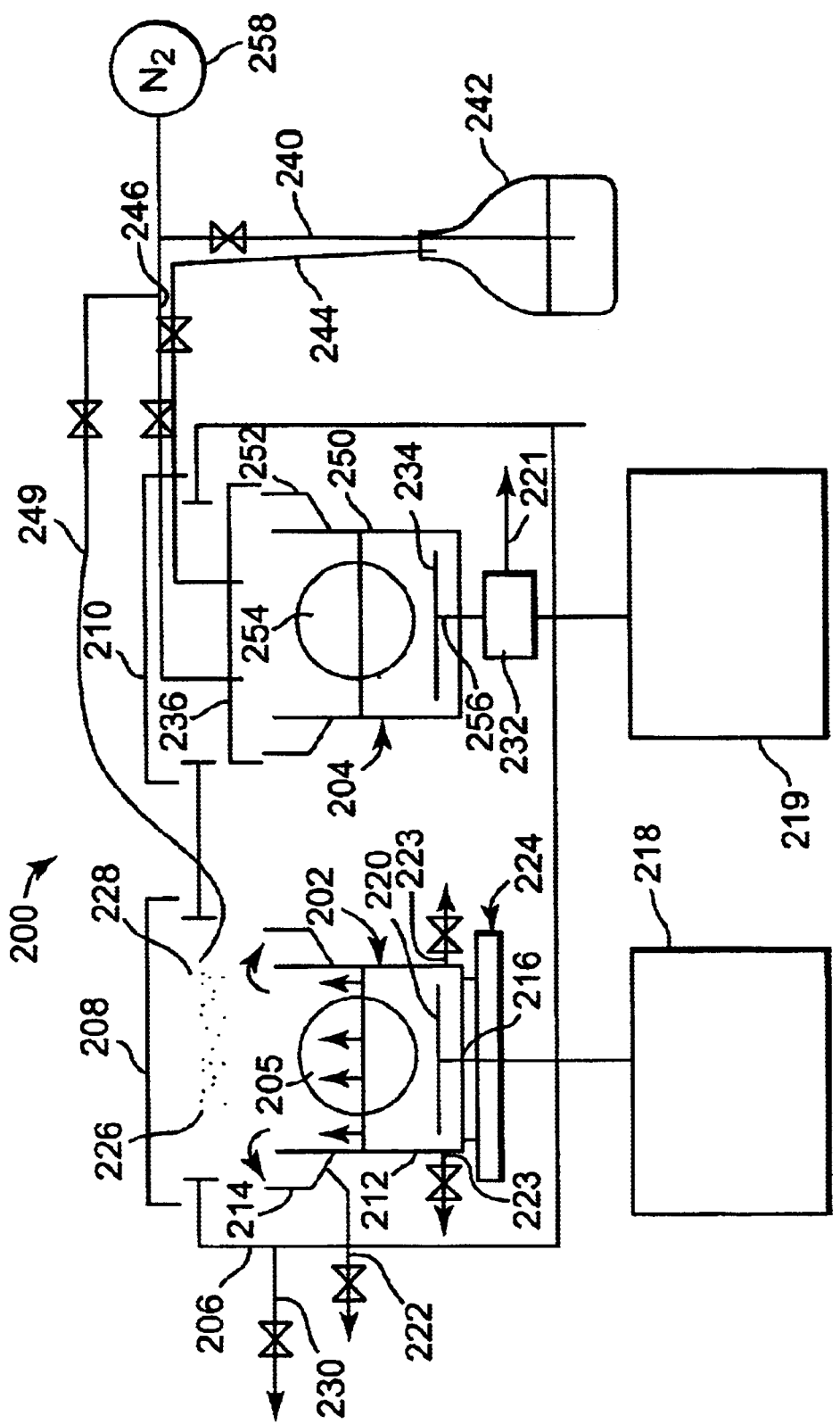
FIG. 3 is a schematic diagram of a twin-tank system of the present invention in which the system includes cleaning capabilities in accordance with the present invention as well as rinse/dry capabilities.

A schematic representation of the Model 6200 apparatus 200 is shown in FIG. 3. Cleaning vessel 202 and rinse/dry vessel 204 are contained inside housing 206. Lids 208 and 210 provide access to each vessel. Housing 206 also includes other access panels and doors (not shown) to allow componentry to be maintained, repaired, and replaced. Cleaning vessel 202 includes inner tank 212 and outer tank 214. One or more substrates 205 are positioned inside inner tank 212 for cleaning by cascading flow(s) of one or more processing liquids. Processing liquids are supplied to inlet 216 from chemical supply 218. Processing liquids are introduced into inner tank 212 through sparger 220. Processing liquid is discharged from outer tank 214 through valved drain line 222. Alternatively, the contents of inner tank 212 can be quickly dumped through one or more valved drain lines 223. Cleaning vessel 202 is operationally positioned on acoustic energy source 224. A blanket 226 of inert gas can be established over cleaning vessel 202 by introducing the inert gas through gas inlet 228. Gas can be exhausted from housing 206 through valved exhaust line 230.

Rinse/dry vessel 204 includes inner tank 250 and outer tank 252. One or more substrates 254 are positioned inside inner tank 250. Processing liquids are introduced into inner tank 250 through inlet mechanism 256 from chemical supply 219. Drain valve 232 can be opened to quickly dump the contents of inner tank 250 through drain line 221. At the bottom of inner tank 250, a baffle or mesh 234 or the like is positioned to distribute incoming processing liquid and to help foster laminar flow of process liquid upward through inner tank 250. At the top, rinse/dry vessel 204 is covered by lid 236 through which process gases may be introduced into rinse/dry vessel 204. For example, as shown, system 200 is set up so that nitrogen gas or nitrogen gas containing trace amounts of a drying enhancement substance such as isopropyl alcohol (IPA) can be introduced into rinse/dry vessel 204. In this regard, nitrogen gas is supplied from nitrogen source 238. The nitrogen can be conveyed through valved supply line 240 to container 242 of liquid IPA. In container 242, the nitrogen is discharged into the liquid IPA, it bubbles upward, and then is conveyed from container 242 to rinse/dry vessel 204 via valved supply line 244. As the nitrogen bubbles through the IPA, the gas picks up a trace amount of the IPA as a vapor constituent. Alternatively, the nitrogen can be conveyed directly to rinse/dry vessel 204 from nitrogen source 238 via valved supply line 246. Gas supply line 249 leads to gas inlet 228. Any of supply lines 240, 244, 246, and/or 249 may be heated (not shown). Also, the gas conveyed to rinse/dry vessel 204may also be filtered (not shown) if desired.

The present invention will now be further described with respect to the following illustrative examples.

EXAMPLE 1

Contaminated silicon wafers bearing a layer of native oxide were cleaned. Before the cleaning procedure, the wafers showed particles counts of greater than 30,000 with respect to particles having a size greater than 0.16 microns. A Yield Up International Model 6200 apparatus was used to carry out the cleaning procedure. This apparatus includes a housing containing a cleaning vessel on the left side, and a STG™ rinse/dry vessel on the right side. The cleaning vessel is a quartz cascade/overflow tank with a megasonic transducer liquid-coupled to the bottom of the tank. The STG™ rinse/dry tank is a standard Yield Up STG™ rinse/dry tank of the type incorporated into the Yield Up Series 1000, 2000, and 4000 systems.

A cassette of 50 wafers was placed into the empty cleaning vessel with the wafers being substantially vertical as shown in U.S. Pat. No. 5,571,337. A cleaning liquid containing approximately 100 ppm anhydrous ammonia gas dissolved in filtered deionized water was introduced into the bottom of the cleaning vessel at a rate such that the surface of the cleaning liquid took 300 seconds to rise from the bottom of the wafers to the top of the wafers. While the liquid level rose, megasonic energy was directed into the cleaning vessel using the system available from Kaijo; Corp. The megasonic energy level was set at "250" on the machines digital display. The water was filtered using the Yield Up International Clean Point® filtration system. The ammonia gas was mixed into the water using the apparatus available from Legacy Systems, Inc. The cleaning liquid temperature was maintained at 60° C.

After the 300 seconds and without dumping the aqueous ammonia, the wafers were then rinsed in the same vessel with filtered deionized water at 60° C. for 200 seconds at a flow rate of about 5 gallons per minute. The wafer cassette was then lifted out of the rinsing water in the cleaning vessel and transferred to the STG™ rinse/dry vessel. The Yield Up International STG™ rinse/dry procedure was then carried out using the standard STG™ process parameters provided by the manufacturer for use in its Model 1000, 2000, 4000, and 6000 Series systems.

The resultant dried wafers were than analyzed for post-clean particle counts. The wafers showed particle counts on the order of only 32 particles having a size greater than 0.16 microns, demonstrating a cleaning efficiency of better than 99.9%.

EXAMPLE 2

The method of Example 1 was used to treat pristine clean prime wafers in order to assess the effects of the cleaning procedure upon the surface roughness and metal contamination of the treated wafers. Surface microroughness was evaluated in an area 2 micron×2 microns at the wafer centers. The results were expressed in root-mean-square (RMS), mean roughness (Ra), and peak-to-valley distance (Rmax) and are listed in the following table:

TABLE 1

Surface Microroughness (angstroms) before and after cleaning.

|  | RMS | Ra | Rmax |
| --- | --- | --- | --- |
| Pre-clean | 0.8 | 0.6 | 15.8 |
| Post-clean | 0.6 | 0.5 | 7.3 |

This data shows that the cleaning operation had no adverse effect upon the surface roughness of the wafers. In fact, the wafers surprisingly were smoother after cleaning.

With regard to metal contamination, TXRF results are summarized in the following table:

TABLE 2

TXRF results ($10^{10}$ atoms/cm$^2$).

|  | Location on wafer | K | Ca | Ti | Cr | Mn | Fe | Ni | Cu | Zn |
| --- | --- | --- | --- | --- | --- | --- | --- | --- | --- | --- |
| Pre-clean | Center | <9 | <6 | <3 | <1.5 | <1.3 | <1.1 | <0.9 | <0.7 | <1.4 |
|  | Middle | <7 | <4 | <5 | <1.1 | <1.0 | <0.8 | <0.7 | <0.6 | <0.8 |
|  | Bottom | <7 | <6 | <4 | <1.5 | <1.3 | <1.1 | <0.9 | <0.8 | <1.0 |
| Post-clean | Center | <9 | <6 | <4 | <1.5 | <1.3 | <1.1 | <0.9 | <0.8 | <1.3 |
|  | Middle | <7 | <5 | <2 | <1.2 | <1.0 | <0.9 | <0.7 | <0.6 | <0.8 |
|  | Bottom | <7 | <5 | <5 | <1.5 | <1.3 | <1.1 | <0.9 | <0.8 | <1.0 |

These results show that no added metal contamination occurred during the cleaning process as a practical matter.

EXAMPLE 3

For comparison purposes, the procedure of Example 1 was repeated, except no anhydrous ammonia gas was dissolved in the filtered deionized water. Thus, the wafers were cleaned only with deionized water. After cleaning, the wafers still showed a particle count of greater than 30,000 with respect to particles greater in size than 0.16 microns.

EXAMPLE 4

A design experiment was performed in order to assess the impact that acoustic energy, the cleaning enhancement substance, and temperature have upon cleaning performance. A Yield Up International Model 6200 apparatus as described in Example 1 was used to carry out the experiment.

The experiment was conducted on respective groups of 200 mm wafers in which three wafers of each group were intentionally contaminated with $SiO_2$, $Si_3N_4$ or W particles, respectively, using an MSP-2300 particle deposition system commercially available from MSP Corporation. Such wafer preparation has been described by Liu, et al., *Institute of Environmental Sciences Proceedings,* 8–16 (1999). Approximately 20,000 to 25,000 particles in the diameter size range of 0.06 micrometers to 0.3 micrometers were deposited over the entire surface of each wafer. Particle counts before deposition ($N_i$), after deposition ($N_d$) and after cleaning ($N_c$) where measured utilizing a KLA-Tencor Surfscan SP1$^{TBI}$ instrument. Particle removal efficiencies were calculated as percent removal using the following formula:

% Removal=((Nd−Nc)/(Nd−N$_i$))×100%

Four experimental runs were carried out. Run No. 1 involved positioning a cassette containing three contaminated wafers and one control wafer into the cleaning vessel of the Yield Up International Model 6200 apparatus. A cascading flow of a cleaning liquid at 60° C. and containing about 50 ppm anhydrous ammonia gas dissolved in filtered deionized water was established. The deionized water was filtered before addition of ammonia using a Yield up International Clean Point® filtration system. A heater included with the Model 6200 apparatus was used to heat the deionized water feed to 60° C. before the ammonia gas was added as well.

The cleaning liquid was introduced into the bottom of the cleaning vessel at a flow rate such that the surface of the cleaning liquid took about 300 seconds to rise from the bottom of the wafers to the top of the wafers. As the liquid level rose, megasonic energy was directed into the cleaning vessel. The megasonic energy level was set at "450" on the machine digital display. After the 300 seconds and without dumping the aqueous ammonia, the of ammonia gas flow was stopped as the wafers were then rinsed in the same vessel with filtered deionized water at 60° C. for an additional 200 seconds at a flow rate of about five gallons per minute. The wafer cassette was then lifted out of the rinsing water in the cleaning vessel and transferred to the STG™ rinse/dry vessel. The Yield up International STG™ rinse/dry procedure was then carried out using the standard process parameters provided by the manufacturer for use in its model 1000, 2000, 4000, and 6000 series systems.

Run No. 2 was identical to run No. 1 except that run No. 2 was carried out under ambient conditions without heating the deionized water, which was supplied at about 20° C. Run No. 3 was identical to run No. 1 except that run No. 3 was carried out without using any ammonia in the cleaning liquid. Run No. 4 was identical to run No. 1 except that run No. 4 was carried out without using any megasonic energy.

The results of this design experiment are shown in the following tables:

TABLE 1

Particle Removal Efficiencies
$SiNO_2$ Particles

| Particle Size | 60° C. | 20° C. | No $NH_3$ | No Meg |
|---|---|---|---|---|
| >0.06 μm | 82% | 86% | 76% | 16% |
| >0.12 μm | 73% | 81% | 51% | 15% |

TABLE 2

Particle Removal Efficiencies
$Si_3N_4$ Particles

| Particle Size | 60° C. | 20° C. | No $NH_3$ | No Meg |
|---|---|---|---|---|
| >0.06 μm | 81% | 84% | 61% | 32% |
| >0.12 μm | 65% | 67% | 25% | 13% |

TABLE 3

Particle Removal Efficiencies
W Particles

| Particle Size | 60° C. | 20° C. | No $NH_3$ | No Meg |
|---|---|---|---|---|
| >0.06 μm | 91% | 96% | 68% | 84% |
| >0.12 μm | 79% | 94% | 50% | 82% |

Surprisingly, run No. 2, which was carried out at 20° C., yielded higher particle removal efficiencies that run No. 1, which was carried out at 60° C. This result was unexpected, because most researchers have reported that particle removal efficiencies increased with an increase in process temperature when utilizing SC-1 cleaning chemistry. The positive relationship between expected removal efficiency and temperature is based upon the conventional belief that particle removal is accomplished via an etching mechanism when SC-1 chemistry is used for cleaning. According to conventional wisdom, therefore, reduced particle removal efficiencies would have been expected at 20° C. as compared to 60° C. because etching rate decreases with decreasing temperature. The fact that the ultradilute ammonia/megasonic process of the present invention was better when carried out at 20° C. indicates that the cleaning mechanism of the present convention is not an etching mechanism such as is associated with SC-1 chemistry. While note wishing to be bound by theory, it is believed that electrostatic repulsion forces, not etching, plays a significant role in the ultradilute chemistry of the present invention.

Without ammonia, run No. 3 demonstrates a significant decrease in particle removal efficiencies. The results suggest that the megasonic energy, in the absence of ammonia, might help to detach a large number of surface-bound particles from a wafer. But then a significant number of the dislodge particles are able to be redeposited back onto the wafer surface. While not wishing to be gone by theory, it is believed that the particles and the wafer surfaces tend to be oppositely charged. As a consequence, electrostatic attraction, at least in part, is causing the particles to settle back onto the wafer surfaces.

Without acoustic energy such as megasonic energy, run No. 4 also demonstrates a significant decrease in particle removal efficiencies These results suggest that the megasonic energy help to break the surface adhesion forces between the particles and the wafer surfaces. The results also suggest that such forces are greater for $SiO_2$ and $Si_3N_4$ than for W.

In summary, the results from this experiment indicate that the ultra-dilute ammonia/megasonic process for the present convention relies upon the megasonic energy to help detach surface bound particles while the high pH of the ultra-dilute, aqueous ammonium hydroxide cleaning liquid helps to prevent reattachment of the particles to the wafer surface. Further, the process appears to be more effective at lower temperature, e.g., 20° C. as compared to higher temperature, e.g., 60° C.

What is claimed is:

1. A method of cleaning a surface of a microelectronic device at a stage of manufacture, comprising the steps of:
   providing a cleaning liquid comprising solvent and ammonia, wherein the solvent and ammonia comprise a volume ratio of solvent to ammonia in the range from about 500:1 to about 500,000:1, and wherein the cleaning liquid does not include hydrogen peroxide;
   positioning the device in a vessel;
   introducing the cleaning liquid into the vessel under conditions effective to help clean the surface of the device, with the proviso that, if the surface of the device is subjected to an oxidizing treatment to facilitate said cleaning of the surface, the introduction of an oxidizing agent to carry out such oxidizing treatment occurs as a pre-treatment prior to the introduction of the cleaning liquid, wherein the cleaning liquid etches 10 angstroms or less of the surface of the device, and wherein the cleaning liquid is at a temperature in the range from about 0° C. to about 25° C. during at least a portion of the time that the cleaning liquid contacts the surface of the device; and
   applying acoustic energy to the cleaning liquid during at least a portion of the time that the cleaning liquid contacts the surface of the device.

2. The method of claim 1, wherein the solvent comprises aqueous liquid.

3. The method of claim 2, wherein the step of introducing the cleaning liquid to the vessel comprises filling the vessel with the cleaning liquid while the device is positioned in the vessel and wherein the acoustic energy is applied to the cleaning liquid as the vessel is filled.

4. The method of claim 2, wherein the providing step comprises dissolving gaseous ammonia in the aqueous liquid.

5. The method of claim 2, wherein the aqueous liquid and ammonia comprise a volume ratio of aqueous liquid to ammonia in the range from about 1,000:1 to about 300,000:1.

6. The method of claim 2, further comprising the step of, prior to the step of introducing the cleaning liquid to the vessel, contacting the surface of the device with a processing fluid comprising the oxidizing agent.

7. The method of claim 2, wherein the step of introducing the cleaning liquid comprises progressively immersing the device in the cleaning liquid, and wherein the acoustic energy is applied to the cleaning liquid while the device is being progressively immersed.

8. The method of claim 2, wherein the aqueous liquid and ammonia comprise a volume ratio of aqueous liquid to ammonia in the range from about 100,000:1 to about 200,000:1.

9. The method of claim 2, wherein the cleaning liquid etches 5 angstroms or less of the surface of the device.

10. The method of claim 4, wherein the aqueous liquid comprises water and wherein the step of providing the cleaning liquid comprises filtering the water with a filter system comprising positively and negatively charged filters.

11. The method of claim 6, wherein the oxidizing agent comprises aqueous ozone.

12. The method of claim 6, wherein the oxidizing agent comprises hydrogen peroxide.

* * * * *

UNITED STATES PATENT AND TRADEMARK OFFICE
CERTIFICATE OF CORRECTION

PATENT NO. : 6,681,781 B2
DATED : January 27, 2004
INVENTOR(S) : Puri et al.

It is certified that error appears in the above-identified patent and that said Letters Patent is hereby corrected as shown below:

Column 2,
Line 50, "surfaces Metal" should be -- surfaces. Metal --.

Column 3,
Line 27, "comprising and ultradilute" should be -- comprising an ultradilute --.

Column 4,
Line 28, "also shatter" should be -- also be shatter --.

Column 5,
Line 13, "removing extremely particles" should be -- removing extremely smaller particles --.

Column 12,
Line 5, "gas an be" should be -- gas can be --.

Column 15,
Line 20, "204may" should be -- 204 may --.
Line 28, "particles" should be -- particle --.
Line 61, "Kaijo; Corp." should be -- Kaijo Corp. --.

Column 17,
Line 48, "the of ammonia" should be -- the ammonia --.

Column 18,
Line 49, "note" should be -- not --.
Line 57, "dislodge" should be -- dislodged --.

UNITED STATES PATENT AND TRADEMARK OFFICE
CERTIFICATE OF CORRECTION

PATENT NO. : 6,681,781 B2
DATED : January 27, 2004
INVENTOR(S) : Puri et al.

It is certified that error appears in the above-identified patent and that said Letters Patent is hereby corrected as shown below:

<u>Column 18 (cont'd),</u>
Line 59, "gone" should be -- bound --.

Signed and Sealed this

Eighth Day of June, 2004

JON W. DUDAS
*Acting Director of the United States Patent and Trademark Office*